(12) United States Patent
Yang et al.

(10) Patent No.: US 8,309,278 B2
(45) Date of Patent: Nov. 13, 2012

(54) GUIDED SELF-ASSEMBLY OF BLOCK COPOLYMER LINE STRUCTURES FOR INTEGRATED CIRCUIT INTERCONNECTS

(75) Inventors: Joel K. W. Yang, Research Link (SG); Karl K. Berggren, Delft (NL); Yeon Sik Jung, Cambridge, MA (US); Caroline A. Ross, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 158 days.

(21) Appl. No.: 12/885,051

(22) Filed: Sep. 17, 2010

(65) Prior Publication Data

US 2012/0009390 A1    Jan. 12, 2012

Related U.S. Application Data

(60) Provisional application No. 61/361,978, filed on Jul. 7, 2010.

(51) Int. Cl.
*G03F 1/50* (2012.01)
*H01L 21/31* (2006.01)
*H01L 21/469* (2006.01)

(52) U.S. Cl. .............................. 430/5; 216/49; 438/947

(58) Field of Classification Search .............. 430/5, 322, 430/325; 438/947; 216/49
See application file for complete search history.

(56) References Cited

U.S. PATENT DOCUMENTS

| | | | |
|---|---|---|---|
| 2007/0281220 A1* | 12/2007 | Sandhu et al. ..................... 430/5 |
| 2008/0299353 A1* | 12/2008 | Stoykovich et al. ....... 428/195.1 |
| 2009/0092803 A1 | 4/2009 | Bita et al. |

OTHER PUBLICATIONS

Bita, I., et al., "Graphoepitaxy of Self-Assembled Block Copolymers on Two-Dimensional Periodic Patterned Templates", Science, Aug. 15, 2008, vol. 321, pp. 939-943.
Yang, J. K. W., et al., "Complex self-assembled patterns using sparse commensurate templates with locally varying motifs", Nature Nanotechnology Letters, Apr. 2010, vol. 5, pp. 256-260.
Jung, Y. S., et al., "Orientation-Controlled Self-Assembled Nanolithography Using a Polystyrene-Polydimethylsiloxane Block Copolymer", Nano Letters, 2007, vol. 7, No. 7, pp. 2046-2050.
Yang, J. K. W., et al., "Using high-contrast salty development of hydrogen silsesquioxane for sub-10-nm half-pitch lithography," Nov./Dec. 2007, J. Vac. Sci. Technol. B, vol. 25, No. 6, pp. 2025-2029.

* cited by examiner

*Primary Examiner* — Stephen Rosasco
(74) *Attorney, Agent, or Firm* — Saliwanchik, Lloyd & Eisenschenk (57) ABSTRACT

Complex self-assembled patterns can be created using a sparse template and local changes to the shape or distribution of the posts of the template to direct pattern generation of block copolymer. The post spacing in the template is formed commensurate with the equilibrium periodicity of the block copolymer, which controls the orientation of the linear features. Further, the posts can be arranged such that the template occupies only a few percent of the area of the final self-assembled patterns. Local aperiodic features can be introduced by changing the period or motif of the lattice or by adding guiding posts. According to one embodiment, an array of carefully spaced and shaped posts, prepared by electron-beam patterning of an inorganic resist, can be used to template complex patterns in a cylindrical-morphology block copolymer. These complex self-assembled patterns can form a mask used in fabrication processes of arbitrary structures such as interconnect layouts.

23 Claims, 8 Drawing Sheets

GUIDED SELF-ASSEMBLY OF BLOCK COPOLYMER LINE STRUCTURES FOR INTEGRATED CIRCUIT INTERCONNECTS

CROSS-REFERENCE TO RELATED APPLICATION

This application claims the benefit under 35 U.S.C. §119 of Provisional Patent Application No. 61/361,978, filed Jul. 7, 2010, which is hereby incorporated by reference in its entirety.

BACKGROUND OF THE INVENTION

Block copolymers (BCPs) are emerging as materials of interest for use in bottom-up nano-scale fabrication techniques. BCPs are composed of chemically distinct polymer chains (blocks) that are covalently bonded at their ends. The very small dimensions of features that can be inherently formed by block copolymers gives rise to possibilities difficult to achieve by more common lithographic processes.

Specifically, BCPs are copolymer systems in which a first block is a chain of $N_A$ repeating units of type A covalently linked to at least a second block that is a chain of $N_B$ repeating units of type B. A BCP of block A and block B is known as a diblock copolymer. In most cases the blocks are of polymers of sufficiently different structure that phase mixing does not occur and phase separation defines the morphology and properties of the block copolymer. The specific nature of the blocks, size of the blocks and number of blocks can be controlled to impose a desired morphology to the system. Characteristic diblock copolymer morphologies (i.e., known equilibrium mesophases) include spheres, cylinders, gyroid, and lamellae.

When a thin film coating of BCPs is annealed, the polymer self-assembles to form nano-scale structures due to microphase separation, often with dimensions in the range of 5 nm to 100 nm. In addition, this microphase separation of a block copolymer thin film can generate dense arrays of microdomains with periodicity as low as 10 nm. Such arrays have been used as lithographic masks to pattern various functional materials, and to create devices including nanocrystal flash memory, nanowire transistors, gas sensors and patterned magnetic recording media.

Block copolymer thin film self-assembly on an unpatterned substrate leads to close-packed arrays of features such as lines or dots, and, hence, have sparked interest for bottom-up nano-scale fabrication techniques, those which arrange smaller components into more complex assemblies, often by formation of the block copolymers on a substrate. However, these features generally lack long-range order, thus limiting their utility for fabrication of devices. Therefore to impose long-range order and generate microdomain geometries not observed in films formed on unpatterned substrates, substrate features, such as chemical or topographical patterns, may function as a template, or guide, block copolymer self-assembly in a top-down nano-scale fabrication technique where larger features are used to direct the assembly of smaller features.

An attractive approach to generate a template is electron-beam lithography (EBL) where it is possible to form template features that are patterned, small, and/or a specific desired geometry. However, the serial nature of EBL, and resulting cost in time and money, makes it advantageous to minimize the density of the EBL-written features required to template a given arrangement of block copolymer microdomains. Even in a production context in which EBL is used only to write a master pattern that is to be replicated by some higher-throughput mechanism (such as nanoimprinting), the time required just to write the master can be prohibitively long.

A challenge in template design is therefore to find a set of template features of minimum complexity that will deterministically program the block copolymer to form a desired final pattern, such as an interconnect level in an integrated circuit, which may contain both periodic and aperiodic features.

Templated self-assembly of block copolymer thin films can generate periodic arrays of microdomains within a sparse template, or complex patterns using 1:1 templates. However, arbitrary pattern generation directed by sparse templates has remained elusive.

Accordingly, there exists a need in the art for methods of templating complex pattern arrangements of self-assembled block copolymer films.

BRIEF SUMMARY

The invention provides complex patterns of self-assembled block copolymer films. Embodiments of the invention provide methods and articles using sparse arrays of posts to both control the in-plane orientation of linear features, according to the commensurability between the post lattice and block copolymer period, and also to create specific non-regular features by locally modifying the post shape and spacing into an arrangement that changes the preferred commensuration condition, resulting in a linear connected pattern that can be routed selectively to form complex bent structures and junctions.

A method of post placement for templates used in the self-assembly of block copolymer thin films is provided. According to one embodiment, the method includes arranging posts with spacing commensurate with the equilibrium periodicity of the polymer, which controls the orientation of the linear features; and making local changes to the shape or distribution of the posts, which direct the formation of bends, junctions and other aperiodic features in specific locations. The use of spacing commensurate with the equilibrium periodicity of the polymer permits linear patterns to be directed by a sparse template that occupies only a few percent of the area of the final self-assembled pattern. The use of particular shapes and distribution of posts can be used to selectively and locally template complex linear patterns. For example, two adjacent posts can be used to direct structures. In addition, the shape of the post can affect the direction of the self-assembled structures.

According to certain embodiments of the invention, an array of carefully spaced and shaped posts, prepared by electron-beam patterning of an inorganic resist, can be used to template complex patterns in a cylindrical-morphology block copolymer.

According to one embodiment, a method of fabricating complex self-assembled patterns is provided. In a specific embodiment, the method includes forming sparse commensurate templates utilizing particular spacing schemes to direct orientation of linear features and localized changes to the shape or distribution of the template posts to direct the formation of bends, junctions, and other aperiodic features in specific locations; and depositing block copolymer on the sparse commensurate templates, the sparse commensurate templates guiding self-assembly of the block copolymer into the complex self-assembled patterns.

According to another embodiment, a method of fabricating a mask is provided that includes: for each linear pattern region, selecting a template post spacing scheme according to the orientation of desired linear features and periodicity of the particular polymer being used for self-assembly; for each transition region or aperiodic region, selecting a template post shape or distribution; forming a template on a mask substrate through e-beam lithography (or another process) using the selected template post spacing schemes and selected template post shapes or distributions; and depositing materials capable of self-assembly onto the mask substrate having the template.

The transition region can be defined as a region of the mask pattern where the pattern changes, or transitions, from one linear pattern region to another linear pattern region. The transition region may be an aperiodic region.

An embodiment of the invention provides an improved template design that can minimize the density of EBL-written features required to template a given arrangement of block copolymer microdomains, while being capable of templating complex pattern arrangements. In one embodiment, the template can occupy as little as 0.1% of the area of the pattern. In certain embodiments the sparse template occupies between about 1% and about 3%. In another embodiment, the template occupies up to 25% of the pattern. When using EBL, the time to form the pattern can be significantly reduced by forming only the template through EBL and then allowing the remaining portions of the pattern to be self-assembled using block copolymers. As the area required to pattern with EBL to form the template is reduced, the usage time of the EBL reduces, thereby reducing cost and total time required to form the pattern.

According to yet another embodiment of the invention, a mask is provided having complex patterns of templates used to guide self-assembled block copolymers that result in periodic and aperiodic features that can be used as a pattern mask for an interconnect level in an integrated circuit.

BRIEF DESCRIPTION OF THE DRAWINGS

FIG. 2A-2C show schematics of a commensurate templating process of a cylindrical morphology block copolymer that can be used in an embodiment of the invention.

forming a (1 1) lattice.

FIGS. 5A-5G show SEM images of self-assembled cylindrical phase polydimethylsiloxane (PDMS) after selective etching to remove the PDMS surface layer and the PS (polystyrene) matrix from a PS-PDMS diblock copolymer.

FIGS. 6A-6F show simulation results of block copolymer microdomain morphologies, indicating the density distribution of the A block of an AB diblock copolymer self-assembled on a post array with $L_x/L_y=1.5$, as the spacing between posts ($L_x/L_o$) is varied. FIG. 6A shows $L_x/L_o=1.5$; FIG. 6B shows $L_x/L_o=1.8$; FIG. 6C shows $L_x/L_o=2.5$; FIG. 6D shows $L_x/L_o=3.36$; FIG. 6E shows $L_x/L_o=4.0$.

FIGS. 9A-9D show SEM images of templated bends and junctions fabricated in accordance with embodiments of the invention.

DETAILED DISCLOSURE

Methods for forming complex self-assembled patterns and articles having complex self-assembled patterns are provided. According to certain embodiments, high-resolution nano-manufacturing is provided through a combination of an economical, high volume block copolymer (BCP) self-assembly technique with a high-precision top-down lithography technique. In one embodiment example, electron beam lithography (EBL) can be used to define sparse structures on a substrate and BCP self assembly can be used to fill in missing structures. According to embodiments, a sparse array of chemically functionalized topographical posts are fabricated to control the self-assembly of dense linear BCP structures to form device-like nanopatterns.

Figure 1:
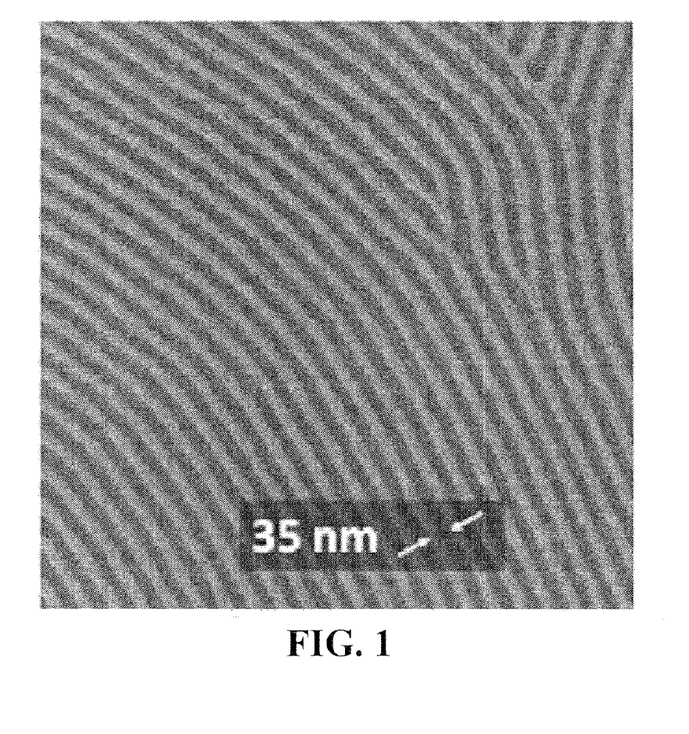
FIG. 1 shows a scanning electron micrograph (SEM) of a cylindrical phase BCP that self-assembled on a Si substrate to form naturally oriented line structures with an equilibrium center-to-center spacing $L_o$ of 35 nm.

Structures formed by BCP self-assembly are smaller and denser than structures that can be typically achieved using conventional photolithography. However, as shown in FIG. 1, the BCP thin film self-assembly on an unpatterned substrate leads to quasiperiodic and randomly oriented and positioned patterns, requiring additional mechanisms to make the self-assembled structures useful as a next generation replacement for conventional photolithography.

Most work on the templated self-assembly of block copolymers for nanolithography has focused on the generation of periodic patterns of parallel lines, close-packed dots or concentric rings, using shallow trenches, sparse post arrays or chemical templates with a periodicity either similar to that of the BCP or a factor two, three or four times larger.

In contrast, embodiments of the invention can provide templates using sparse arrays of posts to both control the in-plane orientation of linear features, according to the commensurability between the post lattice and block copolymer period, and also to create specific non-regular features by locally modifying the post shape and spacing into an arrangement that changes the preferred commensuration condition, resulting in a linear connected pattern that can be routed selectively to form complex bent structures and junctions. This pattern may be particularly useful in microelectronic device fabrication to form, for example, interconnect levels in which the posts are designed to be incorporated into the final desired device layout.

In one embodiment, the posts of the template can occupy as little as 0.1% of the total area of the pattern. In another embodiment, the posts can occupy an area in the range of 0.1% to 1% of the total area of the pattern. In certain embodiments, the posts occupy between about 1% and about 3% of the area of the pattern. In another embodiment, the template occupies up to 25% of the area of the pattern.

Advantageously, by patterning only the posts of the template instead of patterning the entire structure with EBL, throughput (and speed) can be improved, enabling technologies that require high-resolution (sub-20-nm) patterning over large areas to fabricate these structures in a realistic cost-effective amount of time. For instance, a conventional EBL process may require an entire month of exposure while the specific embodiments of the subject methods can produce the pattern in a matter of hours or days.

The patterns made with cylindrical phase BCPs can be used as a mask for further pattern transfer into functional materials. For instance, integrated circuit interconnects or devices can be designed by defining a small fraction of the pattern with electron-beam lithography and using BCPs to complete the layout, followed by pattern transfer into semiconducting or conducting materials.

Figure 2A:
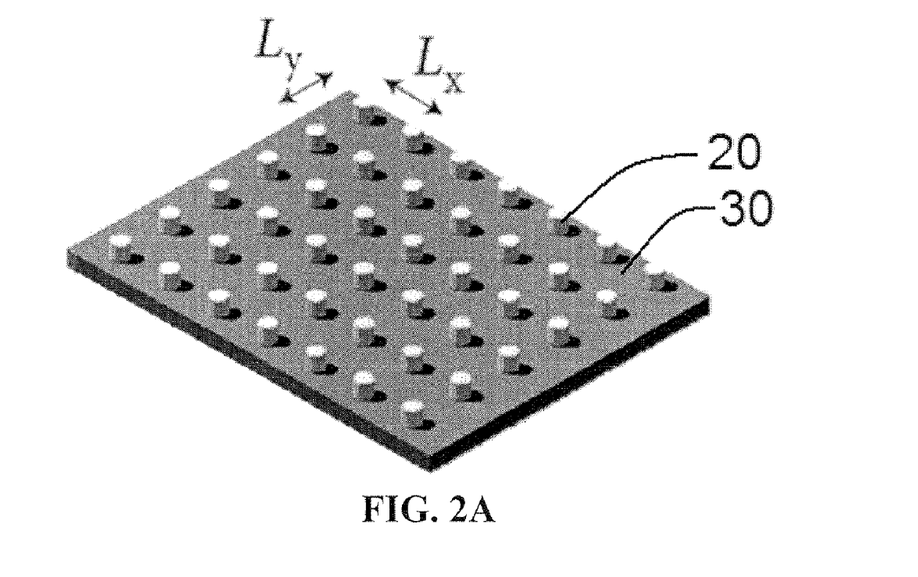
FIG. 2A shows a simplified view of the template formed nanoposts on a substrate with a template lattice $L_x$, $L_y$.
Figure 2B:
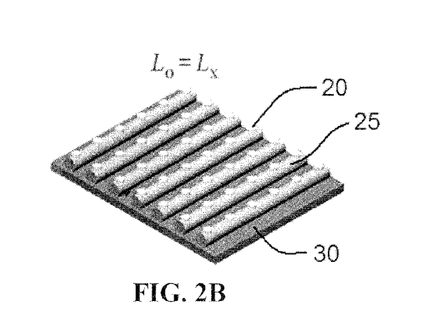
FIG. 2B shows BCP cylinders self-assembled parallel to the y-axis to satisfy commensuration when $L_o=L_x$, forming a (0 1) lattice.
Figure 2C:
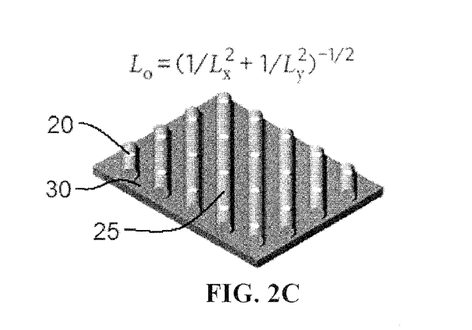
FIG. 2C shows BCP cylinders self-assembled diagonally with respect to the template lattice to maintain their equilibrium spacing when $$L_o = (1/L_x^2 + 1/L_y^2)^{-\frac{1}{2}},$$

FIGS. 2A-2C schematically illustrate a templating process in accordance with an embodiment of the invention. Referring to FIG. 2A, a rectangular array of posts 20 with a template lattice $L_x$, $L_y$, can be fabricated on a substrate 30. This can be accomplished by coating the substrate 30 with a resist and patterning the rectangular array of posts 20 from the resist using EBL. The posts 20 and substrate 30 can be chemically functionalized to ensure that the posts have an affinity for one of the blocks of the BCP and to improve annealing kinetics. BCP layers can be formed at the air and substrate interfaces by spin-coating the BCP on the substrate and then solvent-annealing and etching. The annealing is performed under conditions to cause phase separation of the BCP. For example, for a BCP with cylindrical morphology, the annealing can cause formation of self-assembled cylinders of one block of the BCP in a matrix of the other block of the BCP. The etching can be performed to remove the matrix block while leaving the BCP cylinders 25 on the substrate 30.

Depending on the spacing of the rectangular array of posts, the BCP cylinders 25 self-assemble with particular orientations with respect to the template lattice in order to maintain their equilibrium spacing and satisfy commensuration. Therefore, according to embodiments of the invention, the order and orientation of the BCP cylinders (with equilibrium period $L_o$) can be programmed using a rectangular lattice of posts with lattice parameters $L_x$ and $L_y$ by considering the commensuration condition between $L_o$, $L_x$ and $L_y$. In certain embodiments $L_x$ can be in the range of tens of nanometers to a few hundreds of nanometers. Larger and smaller spacings are possible depending on the equilibrium period of the BCP.

Figure 3:
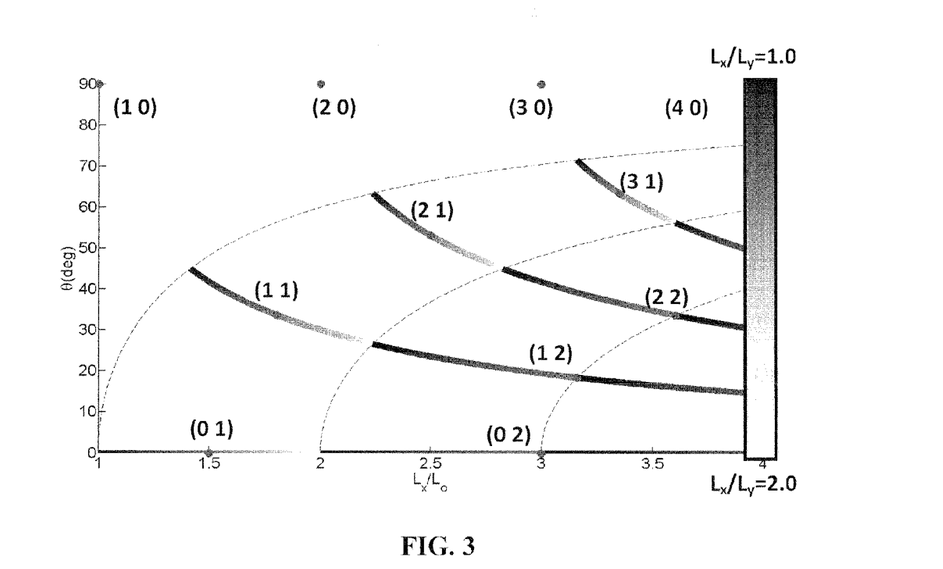
FIG. 3 shows a plot illustrating commensurate conditions for a rectangular lattice where $L_x/L_y$ varies from 1 to 2 for various (i j) BCP lattices, where i and j are integers, over a range of orientation angles θ.

In the case when $L_o = L_x$, the cylinders orient along the y-axis, as shown in FIG. 2B. However, as shown in FIG. 2C, for a larger $L_x$, such that $L_o = (1/L_x^2 + 1/L_y^2)^{-1/2}$, the BCP cylinders align diagonally along the [1 1] direction of the post lattice. These commensurate orientations are designated (1 0) and (1 1), respectively, by analogy to the two-dimensional Miller indexing of crystal lattice planes. The (i j) notation used (where i and j are integers) is consistent with the Miller indexing of planes of crystals in two dimensions. FIG. 3 shows a positive angle plot of the calculated commensurate condition for a generic rectangular template with $L_x = \alpha L_y$, where $\alpha$ is a multiplying factor and the microdomain array has period $L_o < L_x$. Commensuration for lattice (i j) occurs when $L_x/L_o = \sqrt{[i^2 + (aj)^2]}$, and the angle between the cylindrical microdomains and the x-axis is given by $$\theta = \pm \arctan\left(\frac{i}{\alpha j}\right).$$

Degenerate cyylnder lattices can occur at angles of $\pm\theta$ unless $\theta = 0°$ or $90°$.

Thus, by varying the lattice parameters $L_x$ and $L_y$, one can achieve a broad range of block copolymer lattice orientation angles.

More complex block copolymer patterns can be produced by varying the post lattice geometry and also its motif. For example, if a set of posts is replaced by a set of dashes or pairs of closely spaced dots, the PDMS cylinders preferentially align parallel to the dashes, even if this new orientation has a periodicity that is further from the equilibrium spacing $L_o$ than other possible orientations. This alignment parallel to the dashes is assumed to occur so as to minimize the distortion of the cylindrical shape of the microdomains caused by the posts. Varying the placement of the dashes can thus lead to bends, jogs or junctions in well-defined locations.

Furthermore, by strategically designing the template, desired arbitrary structures can be assembled with BCPs. For example, right angle, circular, elliptical (dashed), and other shaped posts can be selectively placed to guide the assembly. That is, dots, dashes, or "Y", "T", or "L"-shaped structures can be used to guide the assembly and form junctions. In addition, local variation of the dot period (spacing) can be used to locally vary the BCP lattice that is formed, thus enabling controlled variation in the lattice across a two-dimensional region, such as would be required for formation of an arbitrary pattern.

One specific application of embodiments of the subject methods is to define interconnect layouts for an integrated circuit. Parallel lines, meanders, T and Y junctions and line terminations can be defined using sparse template features. In a further embodiment, a region where interconnects are not required can be delineated by a ring-shaped pattern.

Although cylindrical morphology BCP is described herein, embodiments of the subject methods can also be used with lamellar morphology, i.e. by making the lamellae to be perpendicular to the surface of the substrate.

A greater understanding of the present invention and of its many advantages may be had from the following examples, given by way of illustration. The following examples are illustrative of some of the methods, applications, embodiments and variants of the present invention. They are, of course, not to be considered in any way limitative of the invention. Numerous changes and modifications can be made with respect to the invention.

Figure 4A:
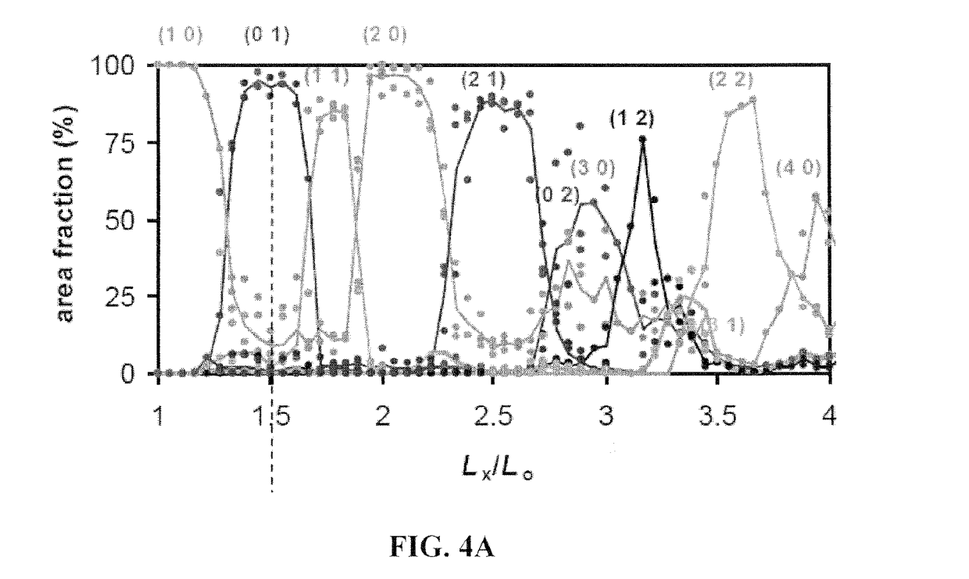
FIGS. 4A and 4B show a plot of area fraction of each lattice versus $L_x/L_o$ for templates with a range of $L_x$ of 30 nm-150 nm and a plot of free-energy per chain for the corresponding lattice orientations, respectively. For orientations other than (i 0) the area fractions shown here represent a slight underestimate of the actual area fraction as a result of an image analysis artifact.
Figure 4B:
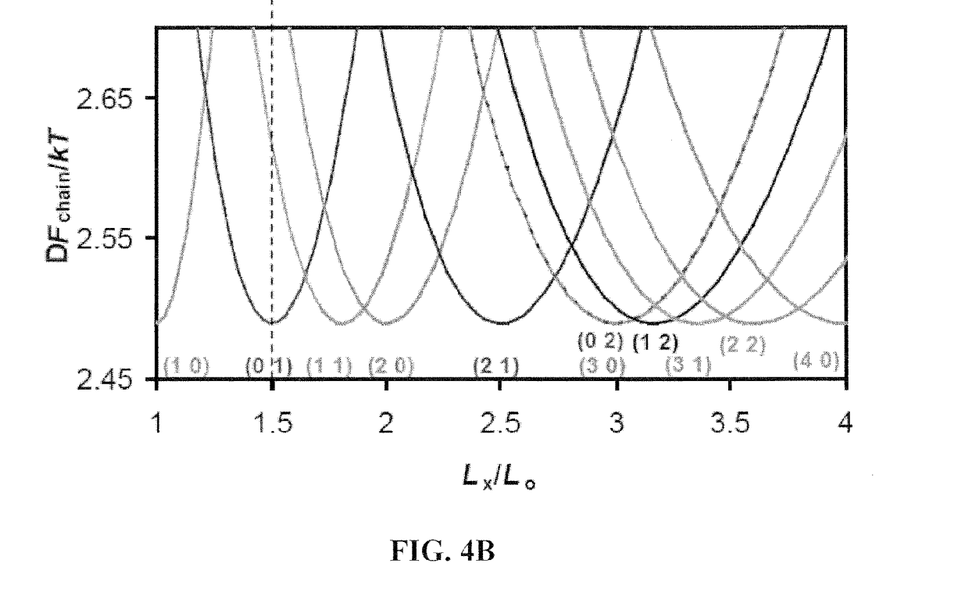

As shown in FIG. 4A, a set of different commensurate BCP lattice orientations can be achieved using a rectangular lattice of posts as the template. When the BCP and post lattices are commensurate, substantially perfect ordering can be achieved in which a single BCP orientation occupies the entire template region. However, for template lattice spacings that are in-between two commensurate conditions, several BCP lattice orientations may form simultaneously. FIG. 4B shows a plot of free-energy per chain for the corresponding lattice orientations.

For FIG. 4B, the free energy model for BCP lattice formation on a post lattice was determined using the expression for the free energy per BCP chain as follows:

$$\Delta F_{chain}/kT = \frac{2Mb}{L}\sqrt{\frac{\chi_{AB}}{6}} + \frac{1}{2}\left(\frac{L^2}{4Mb^2} + \frac{4b\sqrt{M}}{L} - 3\right),$$

where k=Boltzmann constant, T=temperature, b=statistical segment (Kuhn) length, M=number of statistical steps in the BCP chain, L=BCP lattice period, and $\chi_{AB}$=Flory-Huggins interaction parameter between the A and B blocks of the diblock copolymer. For the calculations, b=0.59 nm, M=257, and $\chi_{AB}$=0.26 were used. The equation was then minimized with respect to L to obtain an equilibrium spacing $L_o$=30.8 nm, which closely matched the measured value of 35 nm. The free-energy curves for various BCP lattice orientations are shown in FIG. 4B, for the various (i j) orientations, by using $L=L_x/\sqrt{i^2+j^2}$ in the free-energy model and plotting $\Delta F_{chain}/kT$ as a function of $L_x/L_o$ (with $L_o$=30.8 nm as calculated from the model). FIGS. 4A and 4B show a good agreement between the observed lattice types and those expected from geometrical considerations. For a given BCP orientation, its area fraction was maximized when the corresponding free energy was minimized.

To illustrate the use of sparse arrays to control the in-plane orientation of linear features according to the commensurability between the post lattice and block copolymer period, and the use of local modification of post shape and spacing condition to create specific non-regular features, a polystyrene-b-polydimethylsiloxane (PS-b-PDMS) block copolymer with molecular weight $M_W$=45.5 kg mol$^{-1}$ and minority-block volume fraction $f_{PDMS}$=33.5%, which microphase-separates to form PDMS cylinders within a PS matrix was used.

Figure 5A:
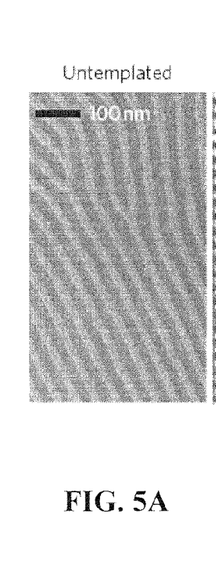
FIG. 5A shows an untemplated monolayer and FIGS. 5B-5G show several commensurate (i j) cylinder lattices formed on templates where $L_x/L_y=1.5$. The cylindrical phase BCPs shown with light grey lines and the arrays of lithographically defined posts are shown as bright dots. The arrows indicate the direction of the BCP cylinders, which makes an angle θ with the x-axis of the template.
Figure 5B:
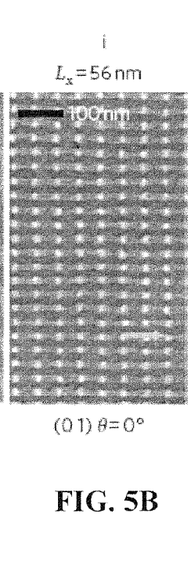
Figure 5C:
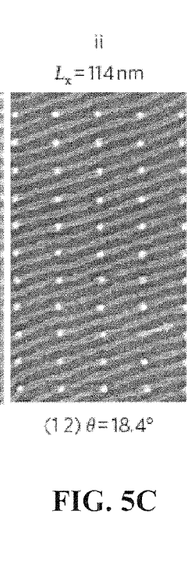
Figure 5D:
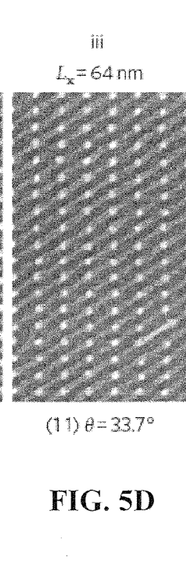
Figure 5E:
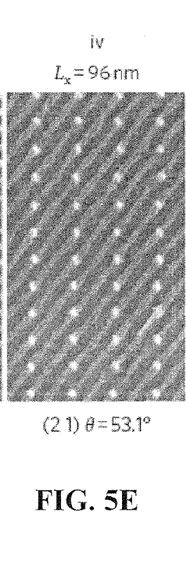
Figure 5F:
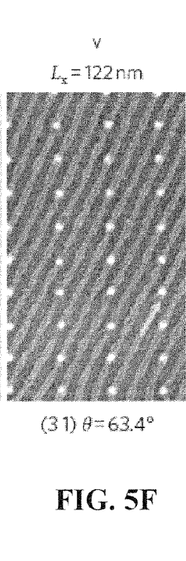
Figure 5G:
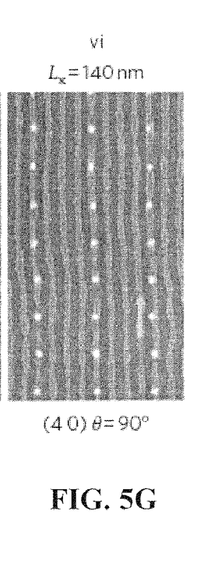

Similar to the process described with respect to FIG. 2A, a rectangular array of posts with heights of ~35 nm and diameters of ~10 nm was fabricated on a substrate by means of EBL exposure of hydrogen silsesquioxane (HSQ) resist. The HSQ posts and native oxide on the silicon wafers were chemically functionalized with a brush layer of PDMS to ensure that the posts had an affinity for the PDMS block of the block copolymer and to improve annealing kinetics. The PS-b-PDMS block copolymer was spin-coated onto a smooth substrate, then solvent-annealed and etched yielding oxidized PDMS cylinders with a natural period $L_o$ of ~35 nm and with varying in-plane orientations, as shown in FIGS. 5B-5G. FIG. 5A shows untemplated self-assembled PDMS cylinders for comparison.

Referring to FIGS. 5B-5G, examples of self-assembly on post arrays with various $L_x$ values for the specific case of templates where $L_x$=1.5$L_y$ are shown. Experimentally, $L_x$ was varied from 30 to 140 nm in steps of 2 nm; and the area coverage of each lattice orientation is plotted against $L_x/L_o$ in FIG. 4A, maintaining the $L_x$=1.5$L_y$ condition. In FIG. 4A, $L_x/L_o$=1.6 corresponds to the sample shown in FIG. 5B.

FIGS. 6A-6F illustrate simulations representing computed equilibrium morphologies of a corresponding two-dimensional lamellar system. A self-consistent field theory (SCFT) provided numerical simulation for the effect of the lattice spacing on the cylinder orientation.

The simulations were performed on a 96×64 rectangular lattice, with $\chi N$=13 ($\chi$ is the Flory-Huggins interaction parameter and N the degree of polymerization) and a volume fraction f=0.5. This volume fraction was chosen to represent the in-plane cylinders as vertical lamellae in the two-dimensional model. FIGS. 6A-6F show the results for $L_x/L_o$ between 1.5 and 3.36, where $L_x$=1.5$L_y$.

Figure 6A:
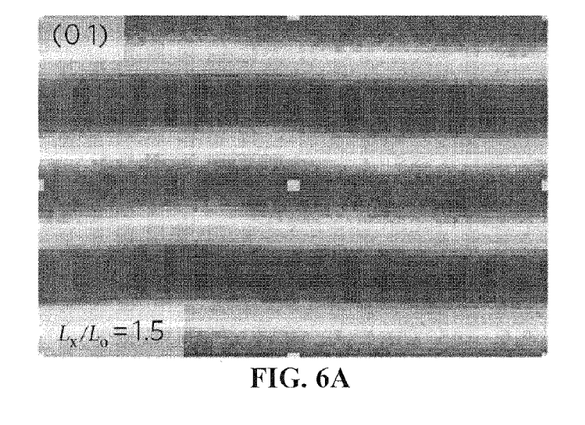
Figure 6B:
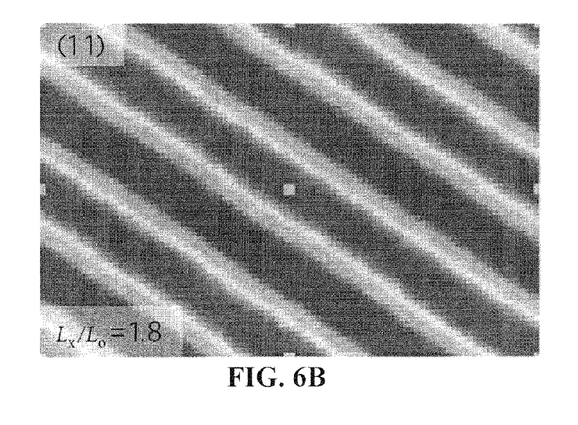
Figure 6C:
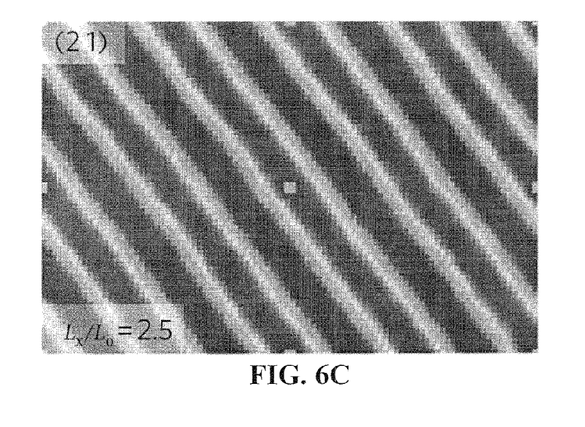
Figure 6D:
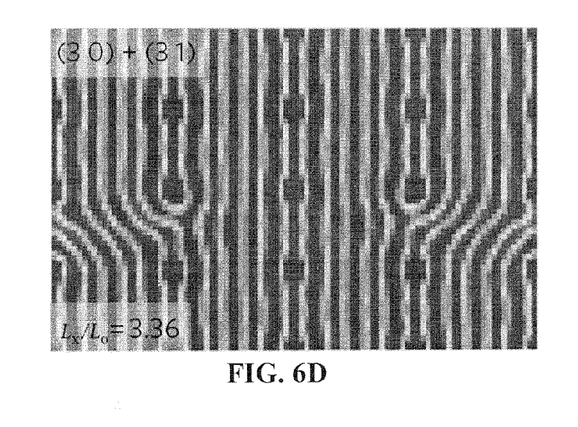
Figure 6E:
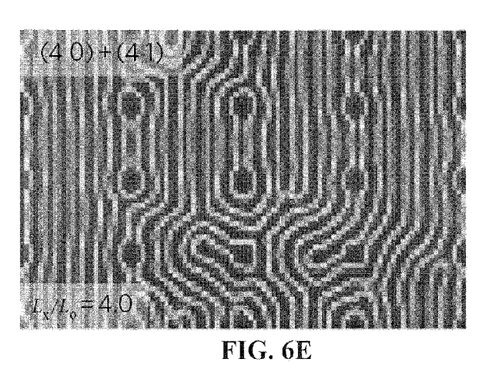
Figure 6F:
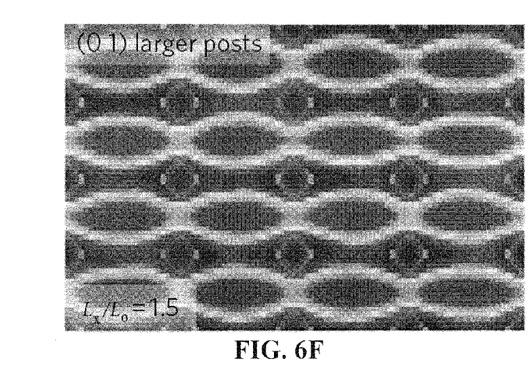
FIG. 6F shows $L_x/L_o=1.5$ with an increased post diameter as compared to FIGS. 6A-6E.

The microdomain orientations that form match those found experimentally, as predicted from the commensurability condition. For $L_x/L_o$=3.36, the model, as shown in FIG. 6D, generated a pattern containing both the commensurate (3 0) and strained (3 1) lattices, which differ by only ~10% in period. Similarly, multiple orientations, including (4 0) and (4 1), were observed for higher values of $L_x/L_o$, as shown in FIG. 6E. A lamellar structure would be expected to accommodate larger changes in its equilibrium spacing than a cylindrical one, promoting the formation of multiple lattices in the model. Nevertheless, annealing of the present simulations by introducing fluctuations that are present in the real system is expected to lower the defect levels seen in simulations such as in FIG. 6E. The model also showed that the self-assembly is insensitive to post size, as shown in FIG. 6F and to $\chi N$ in the range 12-15.

FIGS. 7A-7D show how changes in the post lattice motif led to the formation of a (1 1) cylinder array even though the (2 0) array had a lower strain.

Figure 7A:
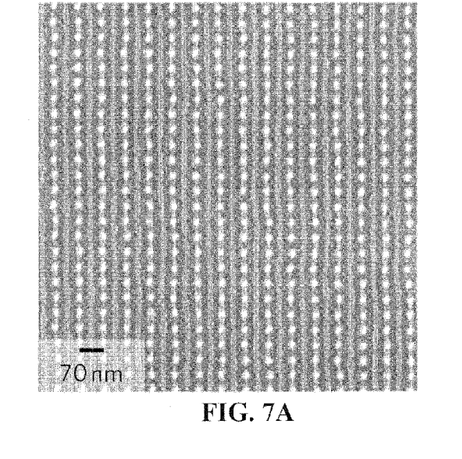
FIGS. 7A-7D show SEM images illustrating local programming of block copolymer arrangement by changing the motif of the template lattice in accordance with embodiments of the invention. The SEM images provide different template motifs with the same $L_x$ spacing of 70 nm and $L_x/L_y=1.5$.

In this example, $L_x$=70 nm=2$L_o$, so the unstrained (2 0) array was expected to form in a lattice with circular posts. FIG. 7A shows that the block copolymer with a natural period of $L_o$=35 nm formed an unstrained commensurate lattice of vertical lines in the (2 0) direction on a template consisting of single circular posts. This orientation was also expected to switch from vertical lines (2 0) to diagonal lines (1 1) as $L_x$ was decreased from 70 to 63 nm.

However, replacing the circular posts with dashes (FIG. 7B) or double dots (FIG. 7C) led to the formation of a (1 1) array, despite its lattice expansion of 11% relative to the equilibrium period of $L_o$=35 nm.

Figure 7B:
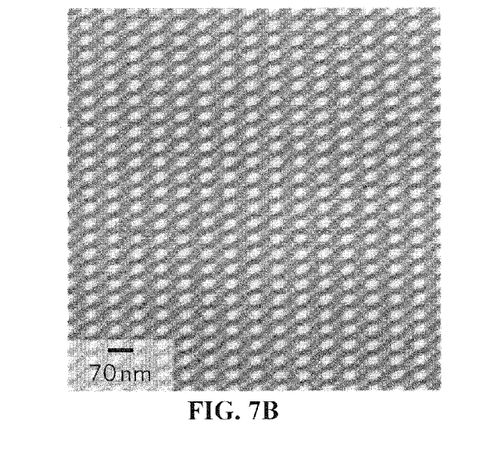
Figure 7C:
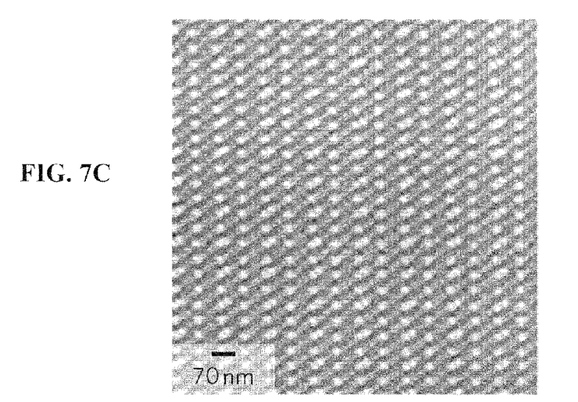

In particular, as shown in FIG. 7B, without changing $L_x$, but by simply changing the template motif from circular posts to diagonal dashes, the block copolymer lattice was made to align to the (1 1) orientation. This switch in orientation occurred despite significant strain in the block copolymer lattice by 11% as the block copolymer period increased from 35 to 38.8 nm. In addition, as shown in FIG. 7C, the same result can be obtained by using a sparse array of double-post structures distributed among single posts.

Figure 7D:
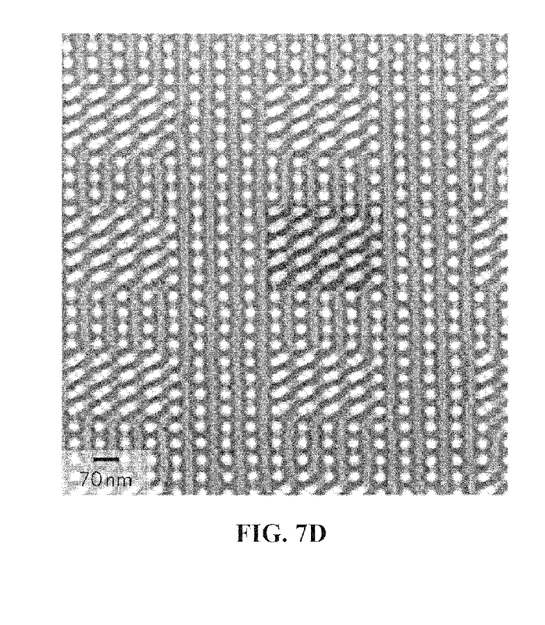

By locally manipulating the template, as shown by the double-dot regions in FIG. 7D, one can direct the block copolymer to form a strained lattice that remains commensurate with the underlying template, but oriented differently from the unstrained commensurate orientation. In particular, when the double-post structures were localized instead of distributed, a template was obtained that programmed regions of diagonal-line arrays surrounded by regions of vertical lines.

Figure 8:
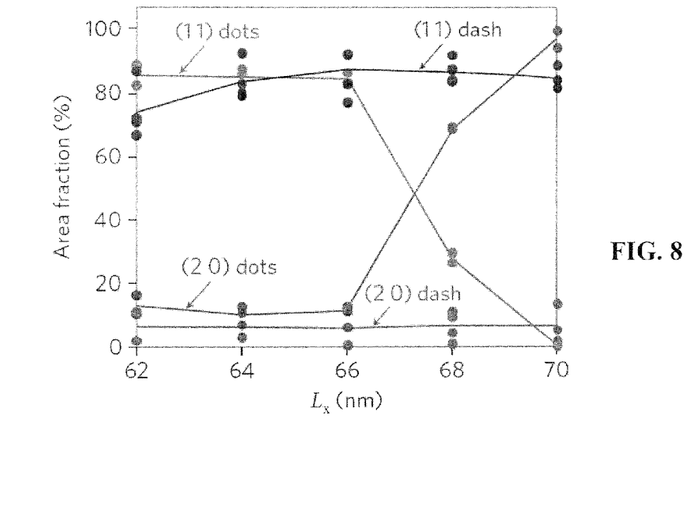
FIG. 8 shows a plot providing quantitative analysis of the local programming, showing the prevalence of the (1 1) and (2 0) lattices as a function of $L_x$. Using circular posts, the block copolymer lattice switched from (1 1) to (2 0) when $L_x$ increased from 62 to 70 nm. However, with the dash (or double-post) motif, the (1 1) orientation was made to form preferably over the entire range of $L_x$ shown.

FIG. 8 shows quantitatively that the dash or double-dot posts extend the range of post period over which the (1 1) cylinder orientation dominates.

A local motif can also be used to select between two energetically equivalent (that is, degenerate) lattices that would otherwise compete randomly in a post lattice. This method can be used to template a variety of more complex structures that have the potential for use in integrated circuit interconnects.

Figure 9A:
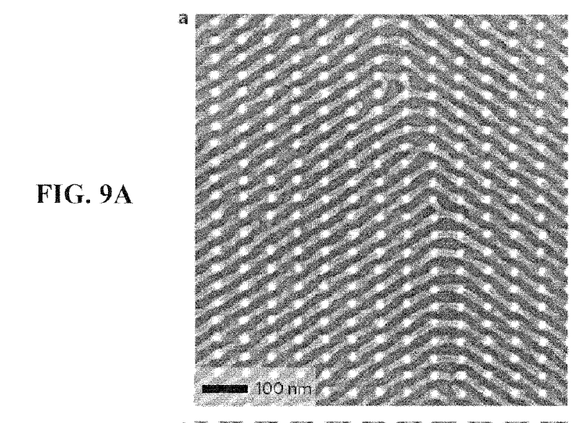
FIG. 9A shows the result of using a template consisting of a rectangular lattice of circular posts, where bends form in random locations as the block copolymer cylinder lattice changes between degenerate variants, in this case (1 1) and (1 −1). For circular posts there was no preference for one variant over another, and defects formed at random locations where one variant switched to another.

FIG. 9A shows an example of a lattice consisting only of dots where a degeneracy occurs between the θ=+33.7° (1 1) and −33.7° (1 −1) cylinder lattices. Both orientations occupy almost equal areas of the post template, and bends have formed at random locations where one orientation has switched to the other. However, bends and junctions can be controlled to format desired positions by making one orientation more energetically favorable than the other, using posts in the shape of dashes.

Figure 9B:
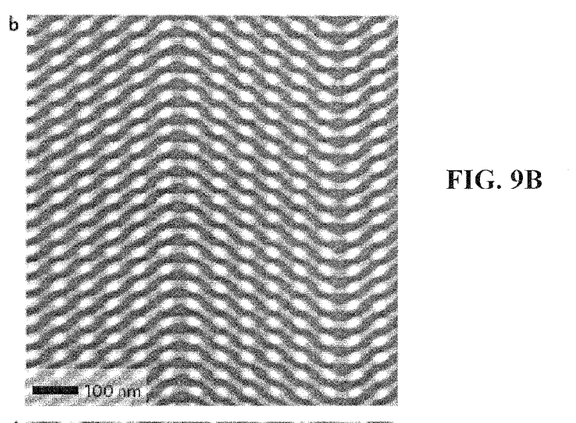
FIG. 9B shows the result of using a template consisting of a rectangular lattice of dashes instead of circular posts, indicating that the degeneracy can be broken to achieve a zig-zag pattern with bends at designated positions.
Figure 9C:
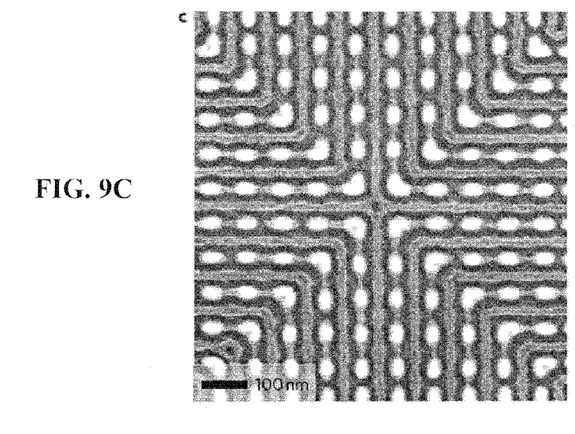
FIG. 9C shows the result of using a template having an array of dashes oriented in the x- and y-directions (and right angle shapes), showing that nested-elbow structures form with a cross-point junction in the center.

Using this method, a 'zig-zag' structure was created as shown in FIG. 9B and a single cross-point with surrounding nested-elbow structures was created as shown in FIG. 9C.

As shown in FIGS. 9A-9C, the BCP microdomains can be bent by up to 90° to form jogs, zig-zags and cross-points. Of course, according to certain embodiments, angles up to 360° (e.g., up to ±180°) can be achieved. Satisfying the commensuration condition and changing the motif of the posts are effective approaches to achieving these results.

Figure 9D:
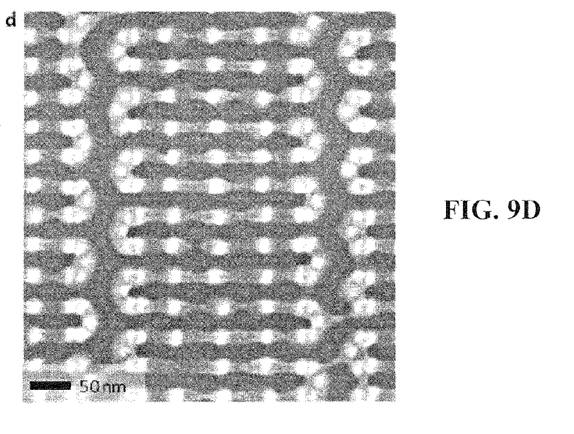
FIG. 9D shows the result of including additional posts formed closely at particular strategic locations, defining a meander structure with sharp bends.

According to further embodiments, placing additional guiding posts in the template can introduce further complexity. For example, FIG. 9D shows that a single cylindrical microdomain can be folded into a tight meander structure by positioning three additional posts at each bend. The underlying rectangular pattern to which these posts were added was identical to that in FIG. 5B, so it is clear that the additional posts reorient the microdomain morphology from a grating into a meander structure. It should be noted that in the example shown in FIG. 9D, the spacing between adjacent meanders was set too large, resulting in defects forming where PDMS lines bridge between meanders.

These results and discussions thus demonstrate two specific and distinct techniques for the formation of arrays of lines containing complex structures. In the first technique, the post period (post spacing) is selected with an appropriate commensurate condition so as to determine the overall in-plane direction of the cylinders. In the experiments, well-ordered cylinders formed over hundreds of nanometer- or micrometer-sized areas up to at least $L_x/L_o=4$, the largest spacing investigated. Lines of any orientation may be templated by choosing an appropriate value of $L_x/L_y$, and $L_x/L_o$ ratios. For example, templates that preserve $L_y$, while varying $L_x$ across the substrate would result in the formation of a pattern with spatially varying orientation, analogous to the results presented in FIGS. 5B-5G. As $L_x/L_o$ increases, there is an increasing tendency to form multiple lattice types with similar period, implying a compromise between the post density and the defect levels in the self-assembled structure. However, the formation of multiple lattice types and variants can be suppressed by using the local motif modifications, such as making at least some of the posts in the shape of dashes (see FIG. 7C) and adding guiding posts (see FIG. 9D). Further, local aperiodic features can be introduced by changing the period or motif of the lattice or by adding guiding posts.

Embodiments of the subject templating approaches can be used for patterning a range of useful structures. For example, to pattern electrical interconnects, one would need to design a template that links a single microdomain between a series of designated points. Regions where no interconnects are desired may be defined by forming the linear features into closed paths, which will be electrically isolated. The final complex patterns can then be transferred into metal using previously demonstrated techniques.

One advantage of certain embodiments of the subject templated self-assembly technique is that the post array requires much less time to write than the entire layout. In the (4 0) lattice, for example (FIG. 5G), a well-ordered array of lines was templated by posts that occupied less than 3% of the area occupied by the lines, giving a factor of 37 increase in throughput compared to patterning the entire area of the linear features using EBL. Additionally, the edge roughness of the features (typically 3-4 nm r.m.s. roughness based on scanning electron microscopy (SEM) images of block copolymers self-assembled in trenches without posts) is determined primarily by the χ-parameter of the block copolymer. The edge roughness can be further reduced by optimizing the post dimensions (to minimize distortion of the cylinders) and the etch process. The process is expected to be scalable to smaller features; for example, a similar block copolymer of 16 kg mol$^{-1}$ forms well-ordered linear features with a period of 17 nm and linewidth of 8 nm when templated on posts.

Accordingly, embodiments of the subject templated self-assembly method can be used to define dense linear patterns with well-defined geometry at high throughput, using a sparse template that determines the in-plane orientation of the block copolymer microdomain array, and directs the formation of non-periodic structures. This process can decrease the patterning time required for making pattern masters by a factor of 30 or more when compared to the use of electron-beam lithography alone. According to further embodiments, arbitrary structures such as interconnect layouts can be patterned using a template design that contains the minimum necessary information (that is, guiding features) to program the formation of a unique block copolymer pattern.

Example Methodology—Template Fabrication

The templates were fabricated using electron beam patterning of hydrogen silsesquioxane (HSQ), a negative-tone electron resist. HSQ films (XR-1541 2% solids from Dow Corning) were spun coated to a thickness of 35 nm on silicon substrates. Single-pixel dots, or short dashes (consisting of a short single-pass line) were exposed in a Raith 150 electron-beam lithography tool at 30 kV acceleration voltage. The samples were developed in a high-contrast developer system to remove unexposed resist and to reveal the topographical nanostructures. The sample was further treated with oxygen/helium plasma (50 W, 2 min) to remove possible organic residues and to completely convert the HSQ structures into silicon oxide.

Example Methodology—Block Copolymer Self-assembly

The topographically patterned substrates were functionalized with a PDMS brush by spin coating a 30-nm layer of hydroxyl-terminated homopolymer (PDMS-OH, 5 kg/mol, Polymer Source Inc.), annealing at 130° C. for 3 hours, and removing unreacted homopolymer in toluene. Diblock copolymers of PS-PDMS with an overall molecular weight of 45.5 kg/mol, a volume fraction of PDMS, fPDMS=33.5%, and a polydispersity index (PDI) of 1.15 were purchased from Polymer Source, Inc. This pair of blocks was selected since it possesses a high Flory-Huggins χ-parameter, giving a large thermodynamic driving force for microphase segregation (χN~50, taking χ=0.26). It also shows a high etch selectivity (>12:1, 90 W oxygen plasma) between the two blocks, which is very desirable for subsequent pattern transfer into functional materials. The BCP was spin-coated onto the template substrates to a thickness of 35 nm and annealed for 30 minutes with a 5:1 mixture vapor of toluene and heptane, which are preferential solvents for PS and PDMS respectively. The annealing of the block copolymer can be accomplished thermally or by solvent annealing.

Example Methodology—Reactive Ion Etching and Imaging

The annealed BCP films were first treated with a 5 sec, 50 W, 10 mTorr $CF_4$ plasma and then a 22 sec, 90 W, 6 mTorr oxygen plasma to remove first the PDMS surface layer and then the PS matrix to leave oxygen-plasma-modified PDMS cylinders on the substrate. The surface morphology was observed using a Raith 150 SEM operated with an acceleration voltage of 10 kV. A thin layer of Au—Pd alloy was sputter-coated on samples in order to avoid charging effects.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A pattern mask for dense nanostructures, the pattern mask comprising:
    a template on a substrate, the template comprising:
        a two-dimensional array of first posts, wherein the first posts are spaced apart from each other in a first direction by a first spacing $L_x$ and in a second direction by a second spacing $L_y$, and
        a second post disposed near one of the first posts, wherein the second post is spaced apart from the one of the first posts by a third spacing, wherein the third spacing is different than the first spacing $L_x$ and the second spacing $L_y$; and
    a polymer pattern self-assembled on the template,
    wherein the first spacing $L_x$ and/or the second spacing $L_y$ is commensurate with an equilibrium periodicity $L_o$ of a block copolymer of the polymer pattern, and wherein the second post is disposed at a position of a bend in the polymer pattern.

2. The pattern mask according to claim 1, wherein the first spacing $L_x$ is in the range of tens of nanometers to a few hundreds of nanometers, the second spacing $L_y$ is smaller than the first spacing, and the third spacing is smaller than the first spacing $L_x$ and the second spacing $L_y$.

3. The pattern mask according to claim 1, further comprising one or more additional first posts adjacent outer first posts of the two-dimensional array of first posts, wherein the one or more additional first posts are spaced apart by the first spacing $L_x$ in the first direction and by the second spacing $L_y$ in the second direction.

4. The pattern mask according to claim 3, further comprising a second two-dimensional array of first posts adjacent at least one of the one or more additional first posts, wherein the first posts of the second two-dimensional array of first posts are spaced apart from each other in the first direction by the first spacing $L_x$ and in the second direction by the second spacing $L_y$.

5. The pattern mask according to claim 1, wherein the first posts are cylindrical in shape and have a circular or elliptical cross-section.

6. The pattern mask according to claim 1, wherein one or more of the first posts have a "T"-, "Y"-, or "L"-shaped cross-section.

7. The pattern mask according to claim 1, wherein the second post is cylindrical in shape and has a circular or elliptical cross-section.

8. The pattern mask according to claim 1, wherein the second post has a "T"-, "Y"-, or "L"-shaped cross-section.

9. The pattern mask according to claim 1, wherein the block copolymer comprises a cylindrical morphology block copolymer.

10. The pattern mask according to claim 1, wherein the block copolymer comprises a lamellar morphology block copolymer.

11. The pattern mask according to claim 1, wherein the template occupies an area less than 25% of the total area of the pattern.

12. The pattern mask according to claim 1, wherein the template occupies an area between about 1% and about 3% of the total area of the pattern.

13. The pattern mask according to claim 1, wherein the template occupies an area in a range of 0.1%-1% of the total area of the pattern.

14. The pattern mask according to claim 1, further comprising additional second posts, each additional second post disposed near a corresponding one of the first posts to provide localized variation of the two-dimensional array of first posts.

15. The pattern mask according to claim 1, wherein the dense nanostructures of the pattern mask represent an interconnect layer for an integrated circuit.

16. A method of fabricating the pattern mask of claim 1, comprising:
    forming the template on the substrate, the template comprising the two-dimensional array of first posts and the second post disposed near the one of the first posts;
    coating the substrate including the template with the block copolymer; and
    annealing the block copolymer to cause microphase separation of the block copolymer, thereby forming the self-assembled polymer pattern.

17. The method according to claim 16, wherein forming the template comprises:
    coating the substrate with a resist; and
    forming a resist pattern comprising the first posts and the second post on the substrate using electron beam lithography (EBL).

18. The method according to claim 17, further comprising chemically functionalizing the resist pattern.

19. The method according to claim 17, wherein the resist pattern provides the first posts and the second post when forming the self-assembled polymer pattern.

20. The method according to claim 17, further comprising transferring the resist pattern comprising the first posts and the second post to the substrate by performing an etching process and removing at least a portion of the resist pattern.

21. The method according to claim 16, wherein the self-assembled pattern comprises parallel lines and bends or curves in one or more of the parallel lines, wherein forming the template comprises:
   forming a rectangular lattice of posts with lattice parameters $L_x$ and $L_y$, and controlling orientation of the self-assembled parallel lines by selecting particular lattice parameters $L_x$ and $L_y$ of the posts for self-assembly of the parallel lines; and
   forming one or more additional posts at or near one or more posts of the rectangular lattice of posts for self-assembly of the bends or curves in the one or more of the parallel lines.

22. The method according to claim 21, further comprising forming an array of extra posts, each extra post disposed adjacent a corresponding one of a plurality of the posts of the rectangular lattice such that double-dot posts are formed by the array of extra posts and the corresponding ones of the plurality of the posts of the rectangular lattice.

23. The method according to claim 22, wherein the orientation of portions of the self-assembled parallel lines along the double-dot posts is further controlled by the location of the extra posts at the circumference of the ones of the plurality of the posts of the rectangular lattice.

* * * * *

UNITED STATES PATENT AND TRADEMARK OFFICE
CERTIFICATE OF CORRECTION

PATENT NO. : 8,309,278 B2
APPLICATION NO. : 12/885051
DATED : November 13, 2012
INVENTOR(S) : Joel K. W. Yang et al.

Page 1 of 1

It is certified that error appears in the above-identified patent and that said Letters Patent is hereby corrected as shown below:

Column 4,
Line 10, "which makes an angle" should read --which make an angle--.

Column 6,
Line 12, "embodiments $L_x$," should read --embodiments, $L_x$--.
Line 29, "$L_x/L_o=\sqrt{[i^2+(aj)^2]}$" should read --$L_x/L_o=\sqrt{[i^2+(\alpha j)^2]}$--.
Line 37, "cy ylnder" should read --cylinder--.

Signed and Sealed this
Twelfth Day of March, 2013

Teresa Stanek Rea
*Acting Director of the United States Patent and Trademark Office*